(12) United States Patent
Leslie

(10) Patent No.: US 7,372,091 B2
(45) Date of Patent: May 13, 2008

(54) SELECTIVE EPITAXY VERTICAL INTEGRATED CIRCUIT COMPONENTS

(75) Inventor: Terrence C. Leslie, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/765,301

(22) Filed: Jan. 27, 2004

(65) Prior Publication Data

US 2005/0164454 A1    Jul. 28, 2005

(51) Int. Cl.
H01L 27/108 (2006.01)

(52) U.S. Cl. ............... 257/296; 257/329; 257/E29.252; 257/E27.086

(58) Field of Classification Search .......... 257/300, 257/306, 329, 328, E29.262, 302, 330, 331, 257/332, 296, E27.086; 438/269
See application file for complete search history.

(56) References Cited

U.S. PATENT DOCUMENTS

| | | |
|---|---|---|
| 4,759,821 A | 7/1988 | Knoedler et al. |
| 4,847,670 A | 7/1989 | Monkowski et al. |
| 4,957,875 A | 9/1990 | Akbar et al. |
| 4,982,257 A | 1/1991 | Akbar et al. |
| 5,059,544 A | 10/1991 | Burghartz et al. |
| 5,064,772 A | 11/1991 | Jambotkar |
| 5,101,256 A | 3/1992 | Harame et al. |
| 5,128,271 A | 7/1992 | Bronner et al. |
| 5,137,840 A | 8/1992 | Desilets et al. |
| 5,235,206 A | 8/1993 | Desilets et al. |
| 5,244,824 A | 9/1993 | Sivan |
| 5,312,782 A | 5/1994 | Miyazawa |
| 5,321,285 A | 6/1994 | Lee et al. |
| 5,331,199 A | 7/1994 | Chu et al. |
| 5,446,312 A | 8/1995 | Hsieh et al. |
| 5,451,538 A * | 9/1995 | Fitch et al. .................. 438/253 |
| 5,521,399 A | 5/1996 | Chu et al. |
| 5,547,893 A | 8/1996 | Sung |
| 5,581,101 A | 12/1996 | Ning et al. |
| 5,583,059 A | 12/1996 | Burghartz |
| 5,583,368 A | 12/1996 | Kenney |
| 5,637,518 A | 6/1997 | Prall et al. |
| 5,677,573 A | 10/1997 | Prall et al. |
| 5,723,370 A | 3/1998 | Ning et al. |
| 5,831,334 A | 11/1998 | Prall et al. |
| 5,963,800 A * | 10/1999 | Augusto ..................... 438/212 |
| 5,998,844 A | 12/1999 | Prall et al. |
| 6,027,975 A | 2/2000 | Hergenrother et al. |

(Continued)

OTHER PUBLICATIONS

Geppert, Linda , "The Amazing Vanishing Transistor Act", *IEEE Spectrum*, (Oct. 2002), 7 pages.

(Continued)

*Primary Examiner*—Matthew C. Landau
(74) *Attorney, Agent, or Firm*—Schwegman, Lundberg & Woessner, P.A.

(57) ABSTRACT

Integrated circuit components are described that are formed using selective epitaxy such that the integrated circuit components, such as transistors, are vertically oriented. These structures have regions that are doped in situ during selective epitaxial growth of the component body. These components are grown directly in electrical communication lines. Moreover, these components are adapted for use in memory devices and are believed to not require the use of shallow trench isolation.

15 Claims, 16 Drawing Sheets

U.S. PATENT DOCUMENTS

| | | | |
|---|---|---|---|
| 6,057,200 | A | 5/2000 | Prall et al. |
| 6,127,242 | A | 10/2000 | Batra et al. |
| 6,157,058 | A | 12/2000 | Ogura |
| 6,159,852 | A | 12/2000 | Nuttall et al. |
| 6,168,995 | B1 | 1/2001 | Kelley et al. |
| 6,197,641 | B1 | 3/2001 | Hergenrother et al. |
| 6,251,693 | B1 | 6/2001 | Nuttall et al. |
| 6,261,894 | B1 | 7/2001 | Mandelman et al. |
| 6,303,425 | B1 * | 10/2001 | Maeda et al. ............... 438/239 |
| 6,309,919 | B1 | 10/2001 | Liu et al. |
| 6,316,309 | B1 | 11/2001 | Holmes et al. |
| 6,326,275 | B1 | 12/2001 | Harrington et al. |
| 6,335,239 | B1 | 1/2002 | Agahi et al. |
| 6,387,716 | B1 | 5/2002 | Nuttall et al. |
| 6,391,695 | B1 | 5/2002 | Yu et al. |
| 6,391,782 | B1 | 5/2002 | Yu et al. |
| 6,399,979 | B1 | 6/2002 | Noble et al. |
| 6,417,015 | B2 | 7/2002 | Nuttall et al. |
| 6,458,699 | B1 | 10/2002 | Nuttall et al. |
| 6,509,239 | B1 | 1/2003 | Nuttall et al. |
| 6,518,622 | B1 * | 2/2003 | Chew et al. ............... 257/329 |
| 6,630,699 | B1 | 10/2003 | Wylie |
| 6,635,924 | B1 | 10/2003 | Hergenrother et al. |
| 6,653,181 | B2 | 11/2003 | Hergenrother et al. |
| 6,656,809 | B2 | 12/2003 | Greenberg et al. |
| 6,687,146 | B2 | 2/2004 | Kurjanowicz et al. |
| 6,790,722 | B1 | 9/2004 | Divakaruni et al. |
| 6,794,699 | B2 * | 9/2004 | Bissey et al. ............... 257/296 |
| 6,803,642 | B2 | 10/2004 | Freeman et al. |
| 6,812,504 | B2 | 11/2004 | Bhattacharyya |
| 6,812,533 | B2 | 11/2004 | Cai et al. |
| 6,812,545 | B2 | 11/2004 | Dunn et al. |
| 6,849,871 | B2 | 2/2005 | Ning |
| 6,864,517 | B2 | 3/2005 | Freeman |
| 6,864,560 | B2 | 3/2005 | Khater et al. |
| 6,888,221 | B1 | 5/2005 | Joseph et al. |
| 2002/0089038 | A1 | 7/2002 | Ning |
| 2002/0131291 | A1 * | 9/2002 | Kurjanowicz et al. ......... 365/69 |
| 2002/0171107 | A1 | 11/2002 | Cheng et al. |
| 2003/0042531 | A1 | 3/2003 | Lee et al. |
| 2003/0057477 | A1 | 3/2003 | Hergenrother et al. |
| 2004/0119136 | A1 | 6/2004 | Cai et al. |
| 2004/0152269 | A1 | 8/2004 | Hergenrother et al. |
| 2005/0087805 | A1 | 4/2005 | Ning |
| 2006/0006444 | A1 | 1/2006 | Leslie |

OTHER PUBLICATIONS

Deffree, Susan , "IBM proves vertical transistor DRAM at 70nm", *Electronic News*, (Jun. 10, 2003),2 pgs.

Hergenrother, J M., et al., "The vertical replacement-gate (VRG) MOSFET: a 50-nm vertical MOSFET with lithography-independent gate length", *Bell Laboratories, Lucent Technologies, Murray Hill*, 4pgs.

ISA, "IBM claims speediest silicon transistor", http://www.isa.org/Template.cfm?Section=Communities&template=/TaggedPage/DetailDisplay.cfm&ContentID=20445, ISA—The Instrumentation, Systems and Automation Society,(Nov. 4, 2002),2 pgs.

Lucent Technologies, "Revolutionary transistor design turns the silicon world on end", http://www.bell-labs.com/news/1999/november/15/1.html, Lucent Technologies, Bell Labs Innovations,(1999),3 pgs.

Lucent Technologies, "Revolutionary transistor turns silicon world on end", (2000),2 pgs.

Ning, T H., "Why BiCMOS and SOI BiCMoS?", *IBM*, 0018-8646,(Nov. 29, 2001),7 pgs.

Geppert, Linda , "Triple Gate Double Play: Transistors with three gates and 3-D geometries will replace today's devices in a few years", *IEEE Spectrum*, (Nov. 2002),18.

"Non-Final Office Action mailed Aug. 20, 2007 in U.S. Appl. No. 11/168,855", 12 pgs.

* cited by examiner

SELECTIVE EPITAXY VERTICAL INTEGRATED CIRCUIT COMPONENTS

TECHNICAL FIELD

The present invention relates generally to vertical integrated circuits, and in particular to apparatus and methods for vertical transistors or memory cells.

BACKGROUND

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices, such as dynamic random access memory (DRAM) devices, are widely used for storing data in systems such as computer systems. A DRAM memory cell typically includes an access device such as a field effect transistor (FET) coupled to a storage device such as a capacitor. The access device allows the transfer of charges to and from the storage capacitor thereby facilitating read and write operations in the memory device. The memory cells are typically arranged in a number of rows and columns to provide a memory array.

The present invention relates to semiconductor devices, and more particularly to a vertically oriented field effect transistor (FET) which includes a dog-bone structure. The present invention also relates to a method of fabricating the aforementioned vertically oriented FET. A challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. With the constantly increasing demand for higher data storage capacity, memory arrays are becoming more dense. Memory density is typically limited by current processing technologies used for fabrication of the memory arrays. One technique for providing higher density memory arrays is to incorporate vertical technology in fabricating the access transistors. Among the concerns in fabricating memory devices is to provide memory cells with minimal leakage to prevent the loss of storage cell data. Further, alpha-particle induced soft errors which alter the data stored in the memory cells should also be considered, and simplification in fabrication techniques may also be desirable.

For the reasons stated above, for other reasons stated below, and for other reasons which will become apparent to those skilled in the art upon reading and understanding the present specification, there is a need in the art for an improved electronic component package and methods of packaging electronic components.

SUMMARY

An embodiment of the present invention is directed to forming vertical integrated circuit structures using selective epitaxy and the resulting inventive structures. In an embodiment, a memory cell includes a vertical access device having a selective epitaxy mesa and an electrical energy storage device on the selective epitaxy mesa. The selective epitaxy mesa includes a bottom source/drain and a top source/drain, and wherein the selective epitaxy mesa further includes a conductive body separating the bottom source/drain from the top source/drain. The top source/drain is vertically spaced from the substrate. The bottom source/drain is an in situ doped region in an embodiment. The top source/drain is an in situ doped region in an embodiment. In an embodiment, the bottom source/drain includes a semi-annular ring around a bottom portion of the selective epitaxy mesa. In an embodiment, the height of the bottom source/drain is about equal to a height of the signal line to which it is attached. In an embodiment, the height of the bottom source/drain is less than the height of the signal line. One example of a signal line includes a buried digit line. Another example of a signal line is a wordline. The structures of an embodiment are formed without shallow trench isolation. The selective epitaxy used to fabricate the vertical body of the mesa is adapted for use with a silicon substrate to selectively form a silicon mesa in an embodiment. The use of selective epitaxy further allows the in situ doping of the mesa during fabrication to form the source and drain regions. In an embodiment a source/drain region extends around an outer periphery of the selective epitaxy mesa. The electrical communication lines can extend completely or partly around the source/drain region. The gates of the access device at least partially surround the insulator such that the gate effects electrical conductivity of the body from more than one angle. In an embodiment, an insulator completely surrounds the body of the mesa with the gate completely overlies the insulator. The portion of the mesa body beneath the gate and intermediate the top and bottom source/drain regions forms the channel of a transistor.

The present invention includes embodiments directed to the fabrication of integrated circuit devices having vertical structures formed by selective epitaxy. An embodiment includes patterning a buried conductor line on a substrate, forming recess through the buried conductor line to the substrate, forming, through selective epitaxy, a vertical mesa in the recess. In an embodiment, a bottom source/drain region is doped while forming the mesa. In an embodiment, a top source/drain region is doped while forming the mesa. Further processing steps form a gate oxide on the mesa and form a gate on the gate oxide at least partially surrounding the mesa. Embodiments of the present invention include forming the structures described herein. The buried conductor line is formed so that it completely surrounds and the bottom source/drain. The selective epitaxy of an embodiment includes using chemical vapor deposition processes that are adapted for selective epitaxy. An embodiment of the present invention further uses homoepitaxy of silicon. The selective epitaxy, in an embodiment, includes exposing a silicon surface to a gas mixture including $H_2$ and $SiH_2Cl_2$ in a temperature range between 600-800 degrees C. In an embodiment, the selective epitaxy is a molecular beam epitaxy.

Embodiments of the present invention also includes substrates, wafers, integrated circuit packages, electrical devices, memory devices, memory units, memory modules, electrical systems, computers, which are fabricated according to the present invention.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. The following detailed description is, therefore, not to be taken in a limiting sense, and the scope of the present invention is defined only by the appended claims and their equivalents.

The present description of the embodiments further make use of terms such as horizontal, vertical, top, bottom, up, down and words of similar import. These terms are meant to refer to orientation of the described element relative to a base substrate such as a wafer.

Figure 1:
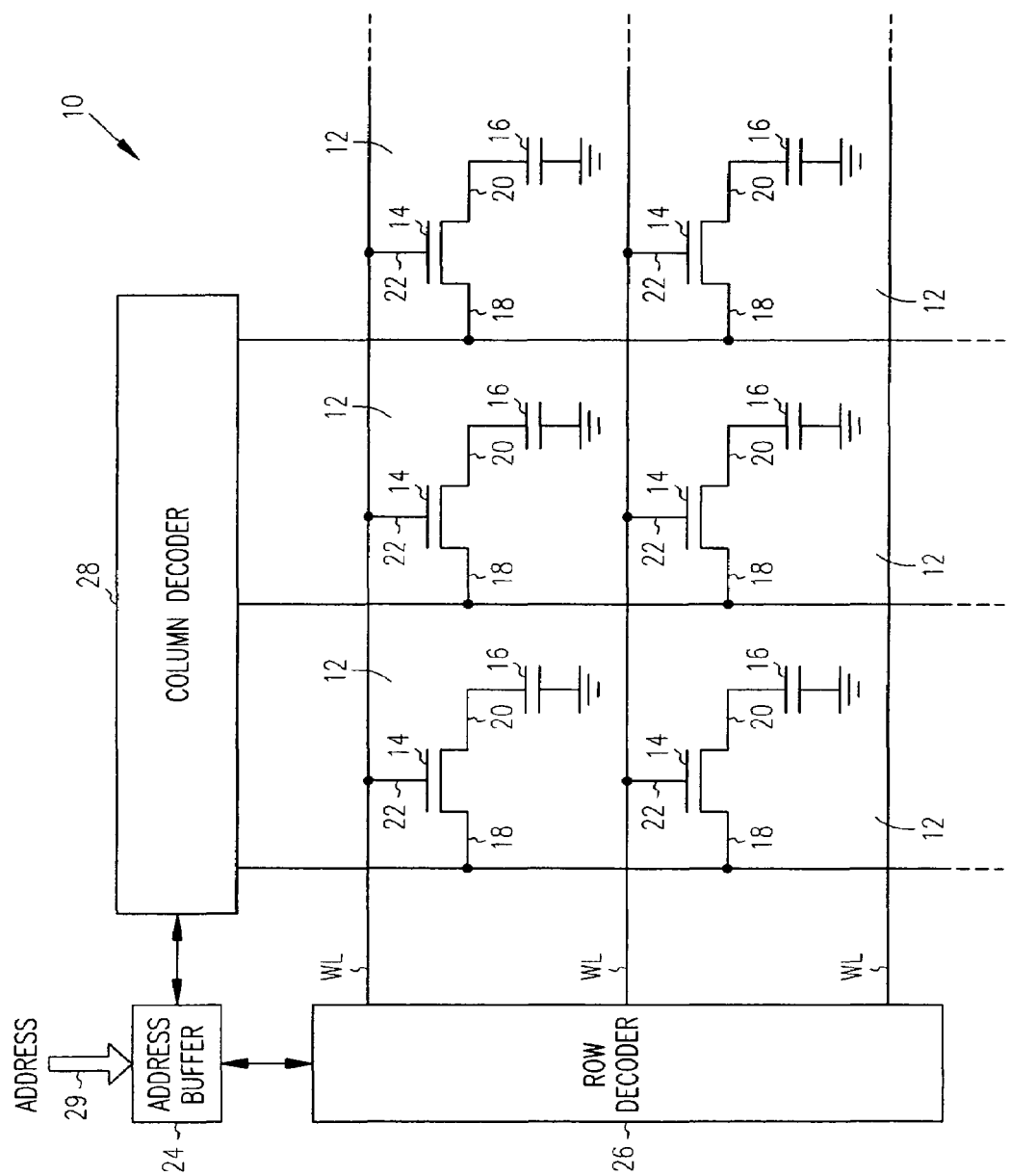
FIG. 1 illustrates a partial schematic illustration of an integrated circuit incorporating an array of memory cells that may be fabricated in accordance with the techniques described herein.

FIG. 1 is a partial schematic illustration of an integrated circuit, such as a memory device 10, incorporating an array of memory cells which may be fabricated in accordance with the techniques described herein. The memory device 10 may be, for example, a dynamic random access memory (DRAM) device. In an exemplary embodiment, the memory device 10 includes a number of memory cells 12 arranged in a grid pattern comprising a number of rows and columns. As can be appreciated, the number of memory cells (and corresponding rows and columns) may vary depending on system requirements and fabrication technology.

Each memory cell 12 includes an access device and a storage device as previously discussed. In the present exemplary embodiment, the access device comprises a field-effect transistor (FET) 14 and the storage device comprises a capacitor 16. The access device is implemented to provide controlled access to the storage device. In the exemplary memory cell 12, the FET 14 includes a drain terminal 18 and a source terminal 20, along with a gate terminal 22 for controlling conduction between the drain and source terminals 18, 20. The storage device, such as the capacitor 16, is coupled to one of the source/drain terminals 18, 20. The terminal of the capacitor 16 that is not coupled to the FET 14 may be coupled to a reference plane.

It should be noted that although the above description depicts the terminal of the access device that is coupled to the capacitor 16 as the source 20 and the other non-gate terminal of the access device as the drain 18, during read and write operations, the FET 14 may be operated such that each of the terminals 18 and 20 operates at one time or another as a source or a drain. Accordingly, for purposes of further discussion, it should be recognized that whenever a terminal is identified as a source or a drain, it is only for convenience as the source and drain could be interchanged as understood in the art. During operation of the FET 14 either terminal could be a source or a drain depending on the manner in which the FET 14 is being controlled by the voltages applied to the terminals 18, 20 and 22 of the FET 14.

As previously described, the memory array is arranged in a series of rows and columns. To implement the data storage capabilities in the memory cell 12, an electrical charge is placed on the drain 18 of the FET 14 via a bitline (BL). By controlling the voltage at the gate 22 via the wordline (WL), a voltage potential may be created across the FET 14 such that the electrical charge at the drain 18 can flow to the capacitor 16. As can be appreciated, by storing an electrical charge in the capacitor 16, the charge may be interpreted as a binary data value in the memory cell 12. For instance, for a single-bit storage device, a positive charge above a known threshold voltage may be interpreted as a binary "1." If the charge in the capacitor 16 is below the threshold value, a binary value of "0" is said to be stored in the memory cell 12.

As previously described, the bitlines BL are used to read and write data to and from the memory cells 12. The wordlines WL are used to activate the FET 14 to access a particular row of a memory cell 12. Accordingly, the memory device 10 includes an address buffer 24, row decoder 26, and column decoder 28. As can be appreciated, the address buffer 24 controls each of the row decoder 26 and the column decoder 28. The row decoder 26 and column decoder 28 selectively access the memory cells 12 in response to address signals that are provided on the address bus 29 during read, write, and refresh operations. The address signals are typically provided by an external controller such as a microprocessor or other memory controller. The column decoder 28 may also include sense amplifiers and input/output circuitry to further enable data to be read to and from the memory cell 12 via the bitlines BL.

In one exemplary mode of operation, the memory device 10 receives an address of a particular memory cell 12 at the address buffer 24. The address buffer 24 identifies one of the wordlines WL of the particular memory cell 12 corresponding to the requested address and passes the address to the row decoder 26. The row decoder 26 selectively activates the particular wordline WL to activate the FETs 14 of each memory cell 12 that is connected to the selected wordline WL. The column decoder 28 selects the bitline (or bitlines) BL of the memory cell 12 corresponding to the requested address. For a write operation, data received by input/output circuitry is coupled to the selected bitline (or bitlines) BL and provides for the charge or discharge of the capacitor 16 of the selected memory cell 12 through the FET 14. The charge corresponds to binary data, as previously described. For a read operation, data stored in the selected memory cell 12, represented by the charge stored in the capacitor 16, is coupled to the selected bitline (or bitlines) BL, amplified by the sense amplifier, and a corresponding voltage level is provided to the input/output circuit in the column decoder 28.

As can be appreciated, the memory array described with reference to FIG. 1 of the memory device 10 may be fabricated through a variety of technologies. One particularly advantageous technique for fabricating the memory cells 12 will now be described with reference to FIGS. 2-10. The advantages of the presently described fabrication techniques will become apparent upon reading the following detailed description with reference FIGS. 2-10. To provide a high density memory device 10, vertical transistor technology wherein the channel of the FET 14 is fabricated perpendicular to the surface of a wafer rather than parallel to the surface, is implemented as further described below. In some applications, vertical FETs are referred to as FINFETs. The term "FIN" is used herein to denote a semiconducting material which is employed as the body of the FET. Advantageously, the vertically oriented access FET 14 may occupy less area on the substrate than other, e.g., horizontal, FET structures. Further, by incorporating vertically oriented access FETs 14, the memory cells 12 are less susceptible to alpha-radiation. Moreover, the channel is made thinner than horizontally planar channels such that essentially all of the channel is effected by the gate.

Figure 2:
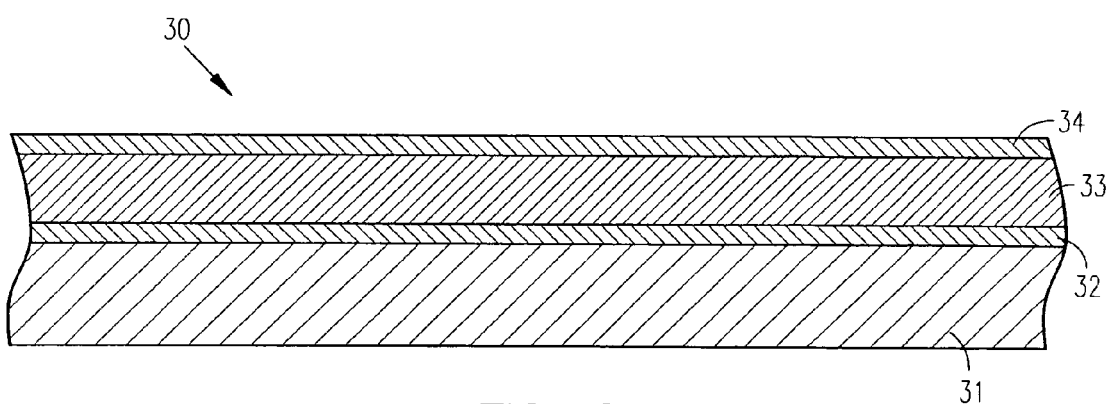
FIGS. 2-9 illustrate a technique for fabricating an access device in a memory cell in accordance with the present invention.

FIG. 2 illustrates an integrated circuit structure 30 that includes a base layer or substrate 31. In an embodiment, the substrate 31 is crystal silicon. In an embodiment, the substrate 31 is a silicon on insulator that may have other integrated circuit structures below or within the substrate 31. The other integrated circuit structures include at least one of a conductor line, capacitors, transistors, and contact pads in an embodiment. An insulator layer 32 is fabricated on the substrate 31. In an embodiment, insulator layer 32 includes silicon dioxide. A conductor layer 33 is fabricated on the insulator layer 32. Conductor layer 33 is patterned as an electrical signal line. In an embodiment, the conductor layer 33 forms buried digit lines (BL's) for a memory device. The conductor layer 33 is patterned by either an additive or subtractive process. A subtractive process includes blanket depositing a conductive material on insulator layer 32. Next, a radiant sensitive film, such as a wet film resist, or a dry film resist, is blanket deposited on the conductive material. The radiant sensitive film is then exposed to a radiant source, e.g., a light source or laser, to the pattern of conductor material. Development of the exposed radiant sensitive film forms a mask that can be used to etch the pattern of conductor lines. In an embodiment, the material of the conductive layer is blanket deposited and then doped to be conductive only the pattern of the conductor layer 33. An "additive" process could also be used where the mask is patterned on the insulator and then conductive material is deposited in the interstices in the mask. In an embodiment, the conductive material for the conductor layer is a doped polysilicon. The conductive pattern of layer 33 consists of a conductive trace or line connected to a multitude of memory bit transistors for a multitude of memory cells in an array. Generally, either metal or silicided/polycided polysilicon forms the conductive line. In an embodiment layer 33 includes a low resistance metal such as titanium or tungsten. In an embodiment layer 33 is tungsten silicide. Due to the large quantity of attached memory bits, its physical length, and its proximity to other features, a digit line is capacitive. The capacitance of a digit line contributes to signal delay in the memory array.

Figure 3:
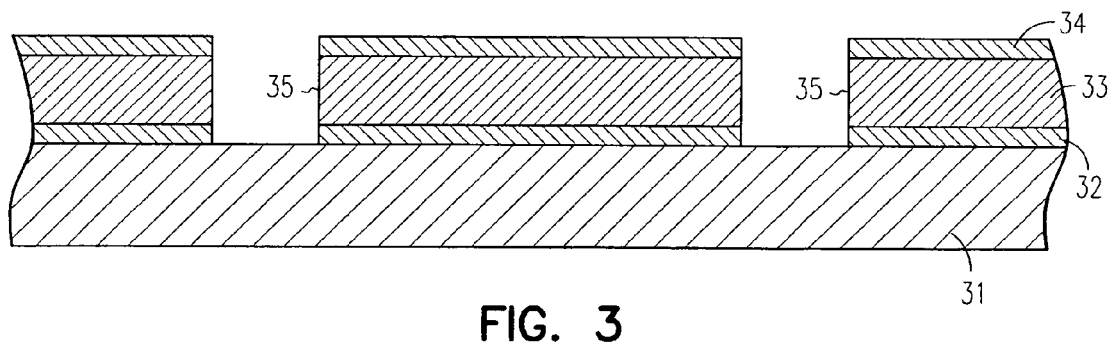

A further insulator layer 34 is formed over the conductive layer 33 and the insulator layer 32. In an embodiment, insulator layer 34 includes silicon dioxide. Insulator layer 34 completely covers the patterned conductive layer 33 and the exposed portions of insulator layer 32. Layer 34 is formed to have a top planar surface in an embodiment. In an embodiment, the top surface of the of insulator layer 34 is planarized, for example by chemical mechanical planarization. In an embodiment, the insulator layers 32 and 34 are thicker than the conductor layer 33. In an embodiment, the insulator layers are thicker than the conductor layer 33 by at least a factor of about 10. A recess 35 is formed through an assembly of insulator 34, conductor 33, and insulator 32 (FIG. 3). Substrate 31 closes the bottom end of recess 35. In an embodiment, the recess 35 is formed by selective etching. For example, a protective mask is patterned on the assembly of insulator 34, conductor 33, and insulator 32 with the areas of the recesses 35 being uncovered by the mask. The insulator 34, conductor 33, and insulator 32 that is not covered by the mask are removed to expose the substrate layer 31. Recesses 35 define the footprint of the access devices, e.g., vertical transistors for memory cells.

Figure 4A:
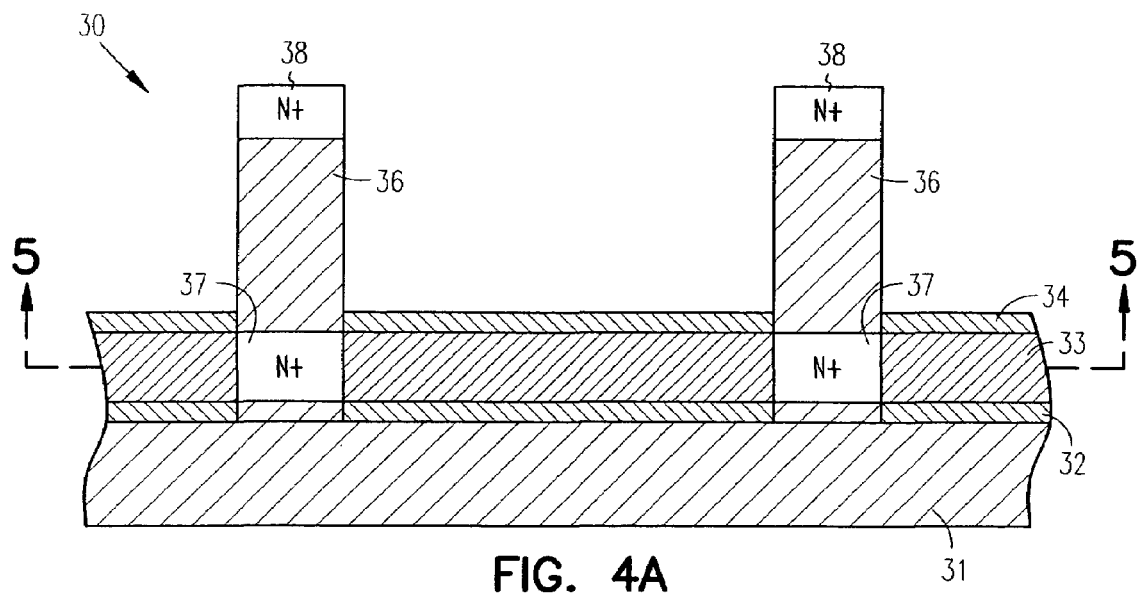
Figure 4B:
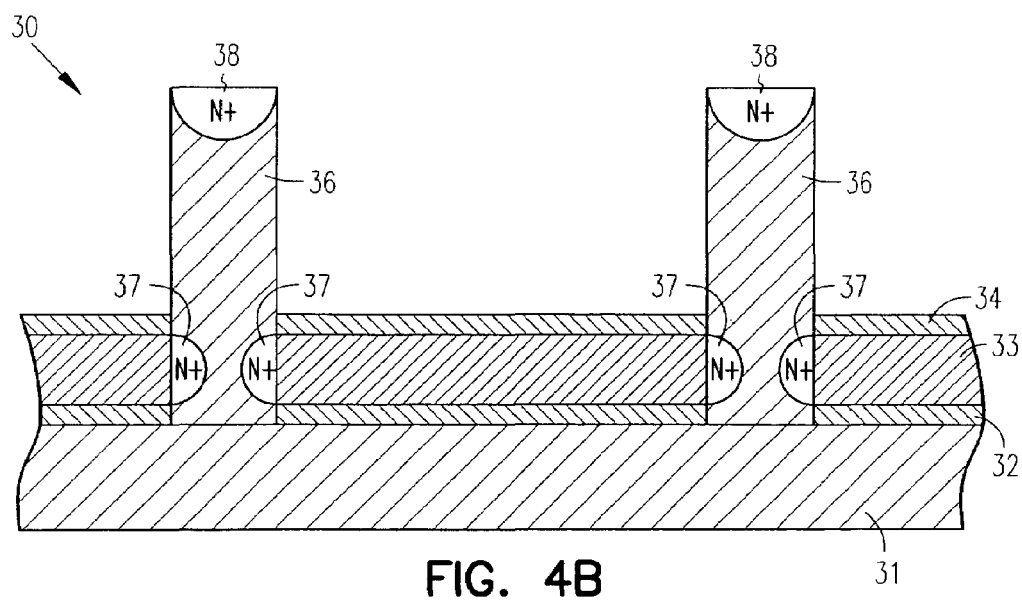

FIG. 4 illustrates the integrated circuit structure during subsequent fabrication. A mesa or body 36 for a vertical integrated circuit structure is selectively formed in the recess 35. The body 36 extends outwardly from the substrate 31 and assembly of insulator 34, conductor 33, and insulator 32. In an embodiment, body 36 has a height that is greater than its cross sectional dimension (i.e., diameter or width). That is, the body is a vertically oriented integrated circuit structure. In an embodiment, the body 36 is formed by selective epitaxy. In an embodiment, the selective epitaxy is a silicon selective epitaxy that grows from a substrate 31 of silicon, i.e., homoepitaxy. A selective epitaxy process includes processes that grow a silicon, e.g., polysilicon or crystalline silicon on only certain surface area. In the present invention, pillar or mesa bodies 36 of silicon are only grown in the recesses 35. The selective epitaxy deposits an epitaxial layer on the exposed substrate 31 in recesses 35. For example, a silicon epitaxial layer is formed in recesses 35 without growth of a silicon layer on the exposed surface of insulator layer 34. This may be accomplished at reduced partial pressure of a reactant so as to suppress nucleation of silicon on the insulator layer 34. In an embodiment, selective epitaxy is effected, for example, using a gas mixture including $H_2$ and $SiH_2Cl_2$ in a temperature range between 600-800 degrees C. Such a gas mixture may have $GeH_4$ added to it in order to set the material composition of the seeds in applications of the present invention having germanium as part of the epitaxially grown layer. Thus, nucleation only occurs at the exposed surface of the substrate. Selective epitaxial layers are formed using a molecular beam epitaxy (gas source or solid source) in an embodiment. In an embodiment, selective epitaxial layers are deposited using chemical vapor deposition processes that are adapted for selective epitaxy. More specifically, the selective epitaxy mesa 36 is deposited by atoms produced by a gas phase reaction striking the substrate surface or the prior deposited selective epitaxy film. The atoms move around the surface until they are correctly aligned and thus can bond to the exposed, previously formed silicon layer. Potential gas sources for silicon epitaxy include a hydrogen reduction of silicon tetrachloride ($SiCl_4$), silane ($SiH_4$), dichlorosilane ($SiH_2Cl_4$ or DCS), trichlorosilane (TCS), or other hydrogen reduced chlorosilanes ($SiH_xCl_{4-x}$).

During the fabrication of the mesa bodies 36, doped regions 37 are formed in contact with the conductor layer 33. In an embodiment, the doped regions 37 are highly doped N+ regions. In an embodiment, the dopant includes at least one of phosphorous or arsenic. It will be recognized by one of skill that certain applications of the present invention may require P-type dopants such as boron. Doping of regions 37 occurs during the selective epitaxy growth of mesa body 36. That is, regions 37 are doped in situ. Regions 37 are formed above the top surface of substrate 31. The outer surface of regions 37 physically contact conductor layer 33. In an embodiment, regions 37 have a height generally equal to the thickness of conductor layer 33. Regions 37 extend around the periphery or circumference of mesa 36 in an embodiment. The regions 37 do not extend above conductor layer 37 so as to not contact insulator layer 34. In an embodiment, the doped regions 37 are formed by ion implantation. In an embodiment doped regions 37 are formed by out diffusion from layer 33. Out diffusion occurs during high temperature processing. The mesa 36 is further fabricated to extend above the insulator layer 34. Doped region 38 is formed at the top of the mesa 36. Doped region 38 is formed using similar techniques as described herein for doped regions 37. As a result of using selective epitaxy and doping at least one region 37 or 38 to form source/drains, the mesas 36 have a substantially continuous orientation of material. That is, there is no boundary between the doped and undoped regions except for the doping material when doping during selective epitaxial growth of mesa 36.

Figure 5:
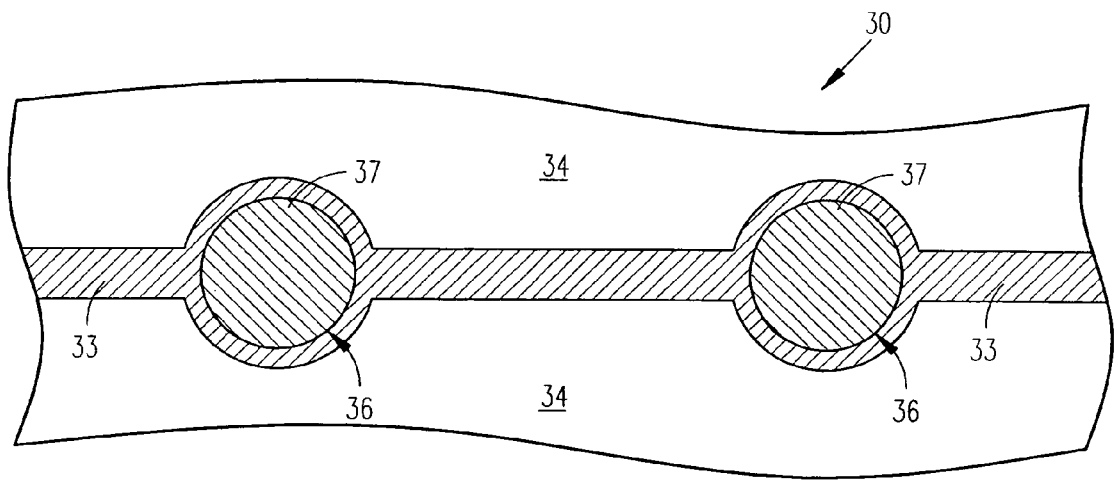

FIG. 5 shows a simplified, cross sectional view of the integrated circuit structure 30. The mesas 36 are circular in cross section. The circumference of mesas 36 are surrounded by annular doped regions 37. Doped regions 37 mechanically contact a respective circular portion of conductive layer 33. In an embodiment, the conductive layer 33 is a signal line, for example, a bit line, for an integrated circuit device.

Figure 6:
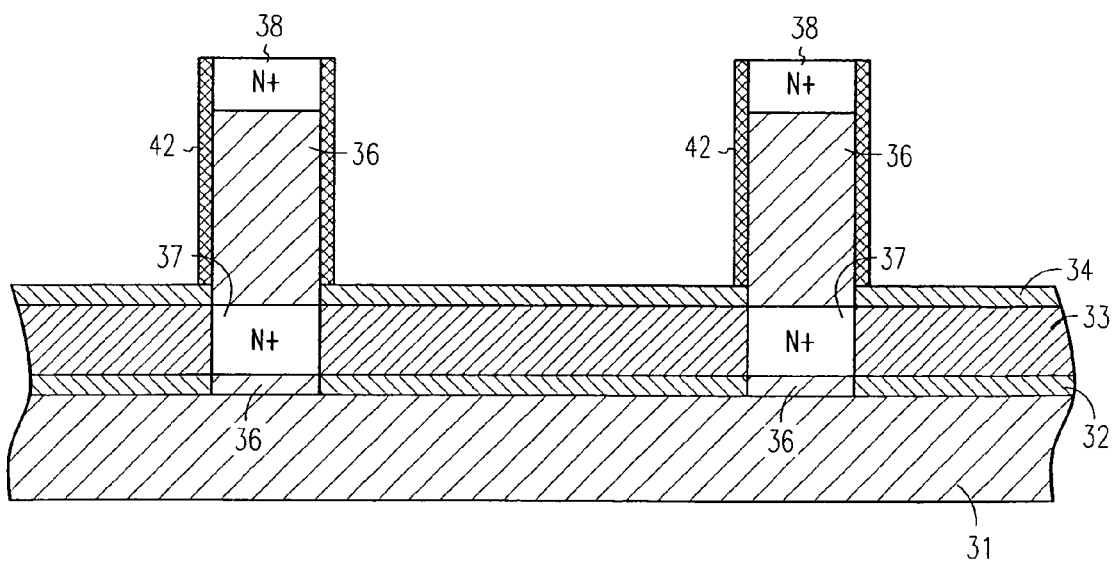
Figure 7:
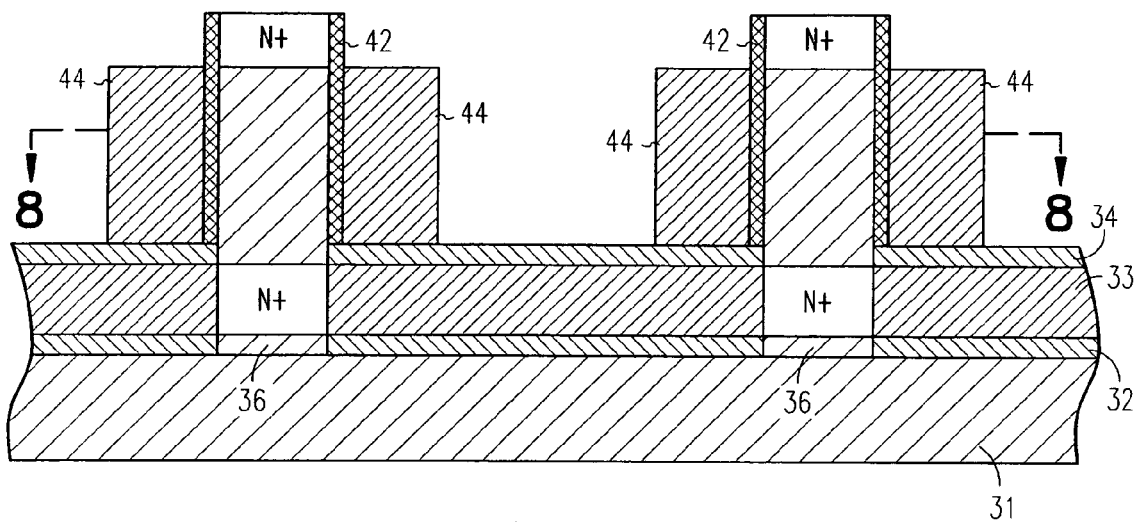
Figure 8:
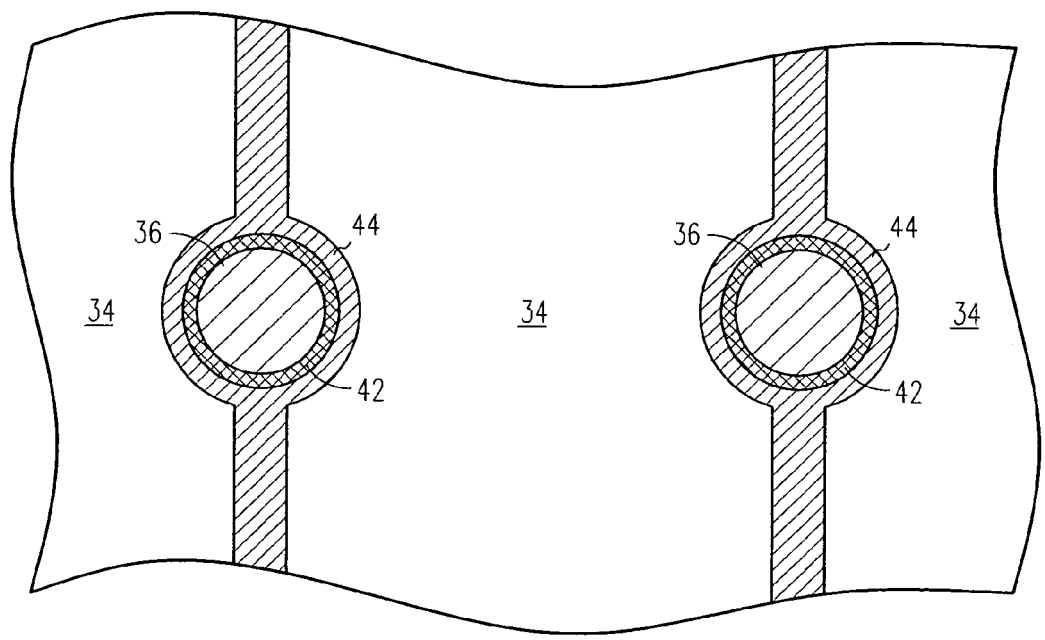
Figure 9:
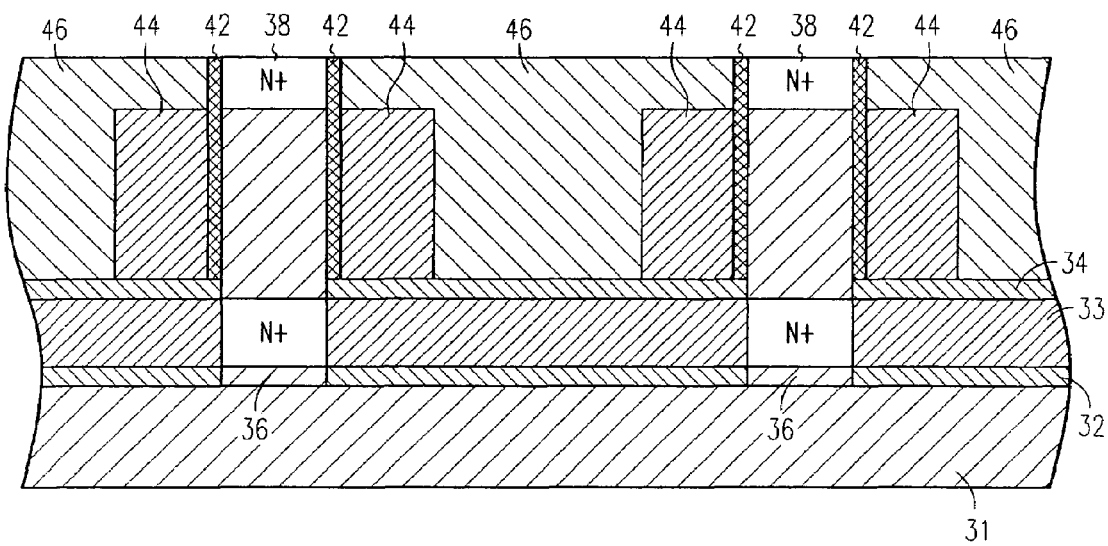

FIG. 6 shows integrated circuit structure 30 after a further fabrication step. An insulating layer 42 is formed on the outer surface of mesa 36 that extends above insulating layer 34. In an embodiment, the insulating layer 42 is a gate oxide material. A gate 44 is formed on the gate oxide 42 (FIG. 7) to a height less than the height of the mesa 36. In an embodiment gate 44 is formed directly on the insulating layer 34. The gate 44 is a conductive and controls operation of the structure 30 as a transistor. FIG. 8 shows a cross sectional view of the integrated circuit structure 30 with the gates 44 extending annularly around the cylindrical insulating layer 42 and mesas 36. The gates 44 are connected to signal lines, which are patterned conductive layers, that extend skew or perpendicular to the buried signal lines 33. After the gates 44 and connected signal lines are formed, the interstices between the mesa 36, gate oxide 42, and gates 44 assemblies upstanding from insulating layer 34 are filled with an insulator layer 46. The insulator layer 46 provides mechanical strength to the assemblies and assists in preventing shorts between the assemblies. Insulator layer 46 is coplanar with the top surface of mesa 36 in an embodiment (FIG. 9). In an embodiment insulator layer 46 is initially formed covering the mesa 36 and removed, for example, by chemical-mechanical polishing, to be coplanar with the top of mesa 36.

Figure 10:
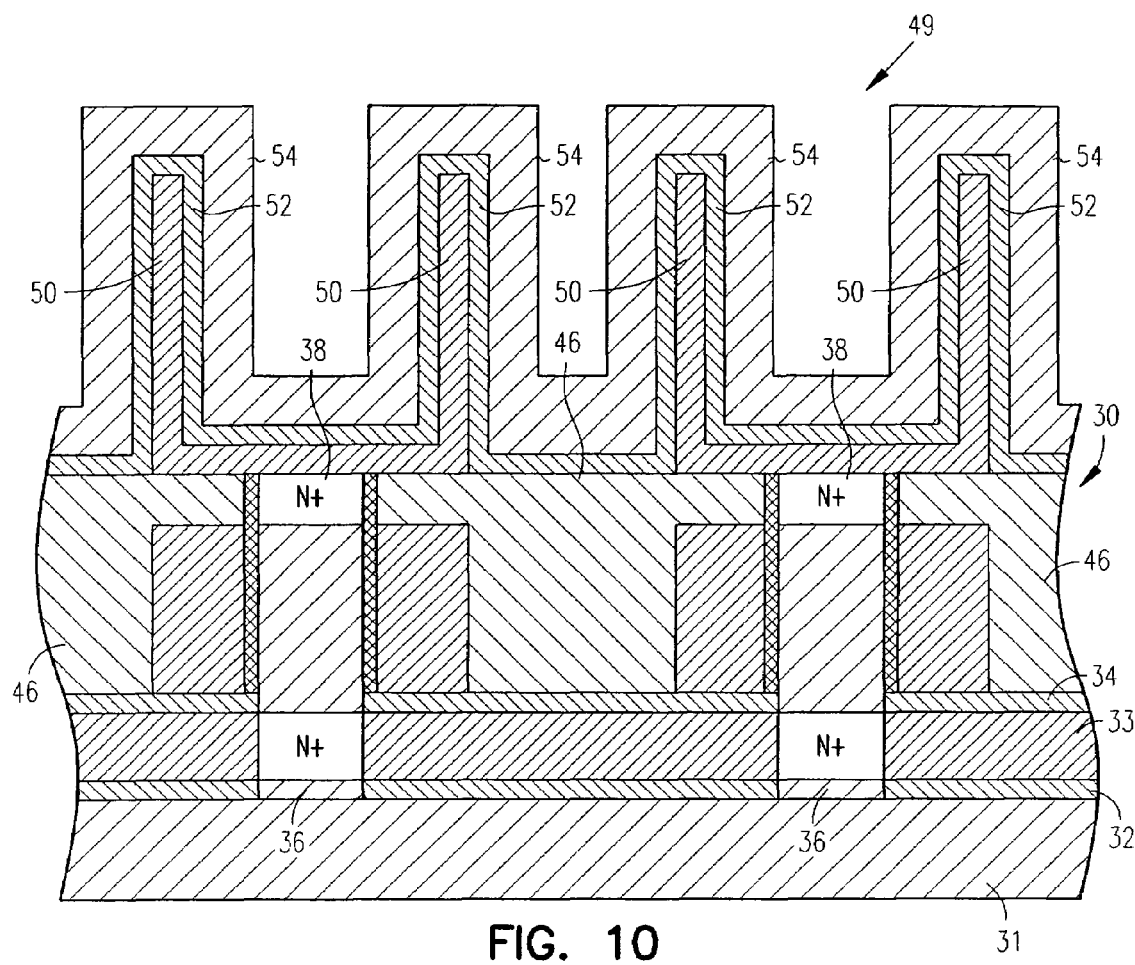
FIG. 10 illustrates a cross-sectional view of the exemplary access device illustrated in FIG. 9 further incorporating an exemplary storage device.

FIG. 10 shows the fabrication of vertical memory cell structure 49 on the top surface of the transistor, integrated circuit structure 30. As shown, a memory cell is a capactive structure that includes a bottom electrode 50, a dielectric layer 52 on the bottom electrode 50, and a top electrode 54 on the dielectric layer 52. The dielectric layer 52 electrically and physically separates the top and bottom electrodes such that one electrode, i.e., the bottom electrode 52, stores an electrical charge to represent a positive value ("1") or does not store a charge to represent a zero value ("0"). The bottom electrode 50 is shown with a U-shape in cross section with the web thereof directly on the upper doped region 38 of mesa 36. Dielectric layer 52 completely covers the top surface of the bottom electrode 50 and any exposed top surface of the insulator layer 46 so as to electrically isolate adjacent memory cells. Top electrode 54 is deposited on the dielectric layer 52 in a continuous manner so as to completely cover the dielectric layer 52. The top electrode 54, in the illustrated embodiment, is shared by a plurality of individual memory cells.

Figure 11:
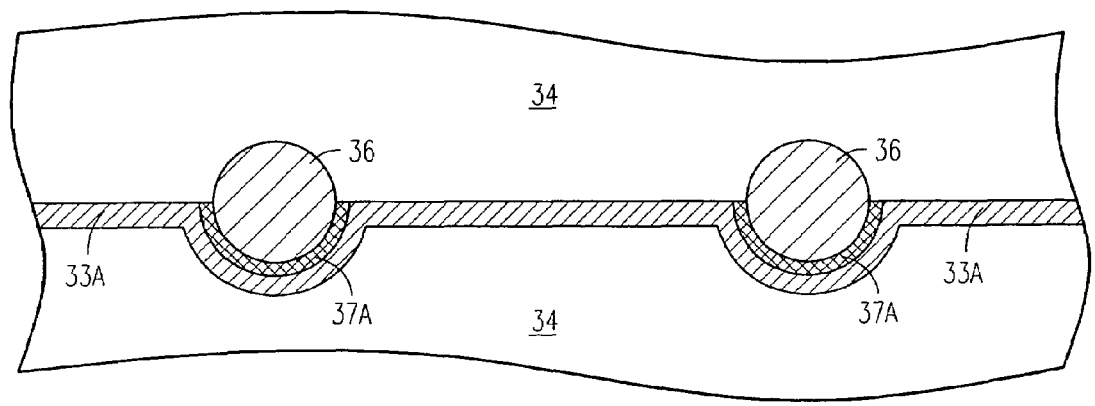
FIG. 11 illustrates a cross-sectional view of an alternate embodiment of a bitline fabricated in accordance with the present techniques.

FIG. 11 shows a further embodiment of the present invention. More specifically, FIG. 11 shows a cross-sectional top view of an alternate embodiment of the structure illustrated with reference to FIG. 4 and taken along cut lines 5-5. As can be seen, the doped regions 37A (reference numbers are the same as in the prior figures but with the suffix A added) is patterned to provide semi-annular rings around the mesas 36. Elements that are essentially the same as those described above are labeled with the same reference numbers. Elements that differ from those described above are labeled with the same reference number with the suffix "A." Thus, the doped region 37A, which in an embodiment forms the bitlines of the memory array described with reference to FIG. 1, extends to connect each of the mesas 36 in a single column. Thus, the present embodiment includes a doped polysilicon region 37A which is patterned to only partly extend around of the mesa 36. Advantageously, the FIG. 11 embodiment may provide for further pitch reduction and thus, reduction in the area of each memory cell and overall die size.

Figure 12:
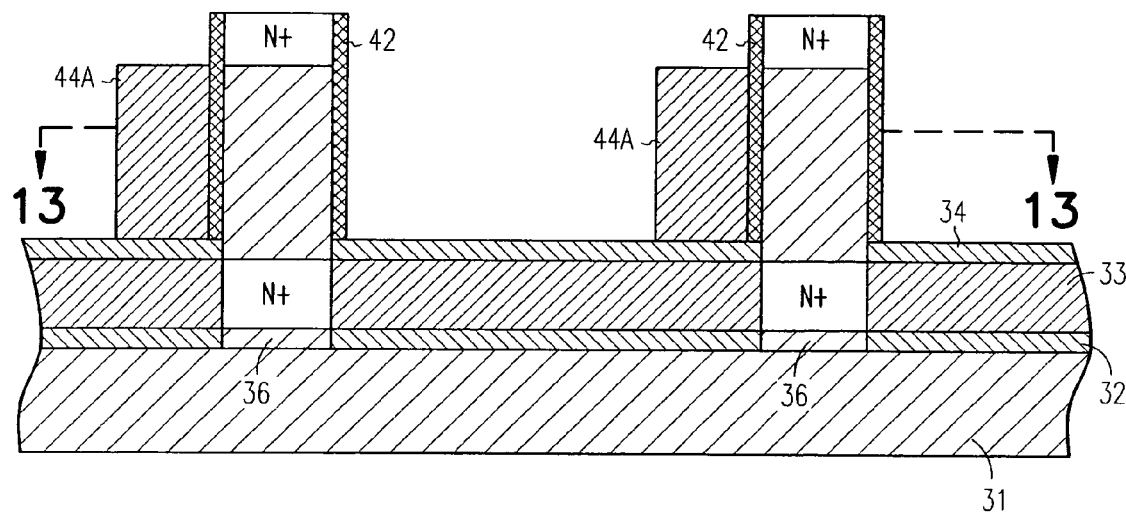
FIGS. 12 and 13 illustrate cross-sectional views of an alternate embodiment of a wordline fabricated in accordance with the present techniques.
Figure 13:
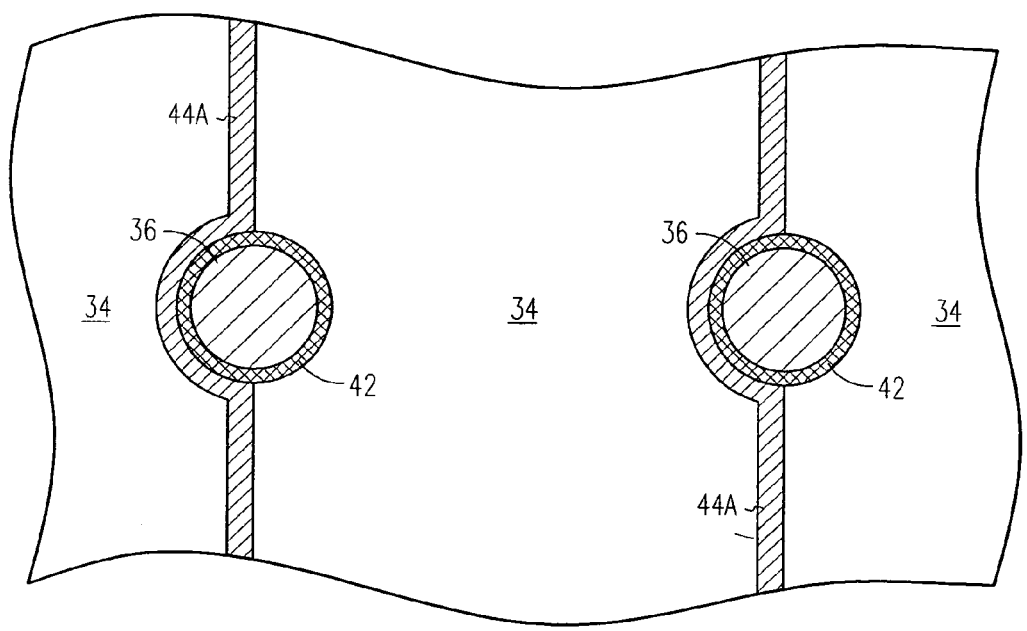

Similarly, the wordline WL, may be patterned to provide a semi-annular ring only partly around the selective epitaxy mesa 36. FIGS. 12 and 13 show an embodiment of the wordline WL, incorporating semi-annular rings. FIG. 12 shows a structure similar to the structure depicted in FIG. 7. Here, after deposition of insulator layer 34 and the growth of the gate oxide layer 42, a polysilicon layer is deposited, patterned and etched to form the polysilicon layer 44A having semi-annular rings. As can be appreciated, the wordline polysilicon layer 44A extends in a direction perpendicular to the page with reference to FIG. 12. Thus, the view of the structure illustrated in FIG. 12 includes the polysilicon layer 44A on only one side of the mesa 36. The wordline polysilicon layer 44A is patterned about a portion of the outer surface of the mesa 36 as shown in FIG. 13.

FIG. 13 shows a cross-sectional top view of the FIG. 12 embodiment taken along cut lines 13-13. Wordline polysilicon layer 44A is patterned to provide semi-annular rings around and in direct contact with mesa 36 intermediate the doped regions 37 and 38. The wordline polysilicon layer 44A is patterned such that it runs perpendicular to the bitline polysilicon layer 33A. While FIGS. 11-13 illustrate semi-annular rings, it should be evident that an annular ring may extend around any desirable portion (e.g. more than half or less than half) of the mesa 36. For instance, it may be advantageous to provide partially annular rings that extend around only a quarter to a third of the circumference of the mesa 36. Alternatively, it may be advantageous to provide partially annular rings that extend around two-thirds to three-quarters of the circumference of mesa 36.

Figure 14:
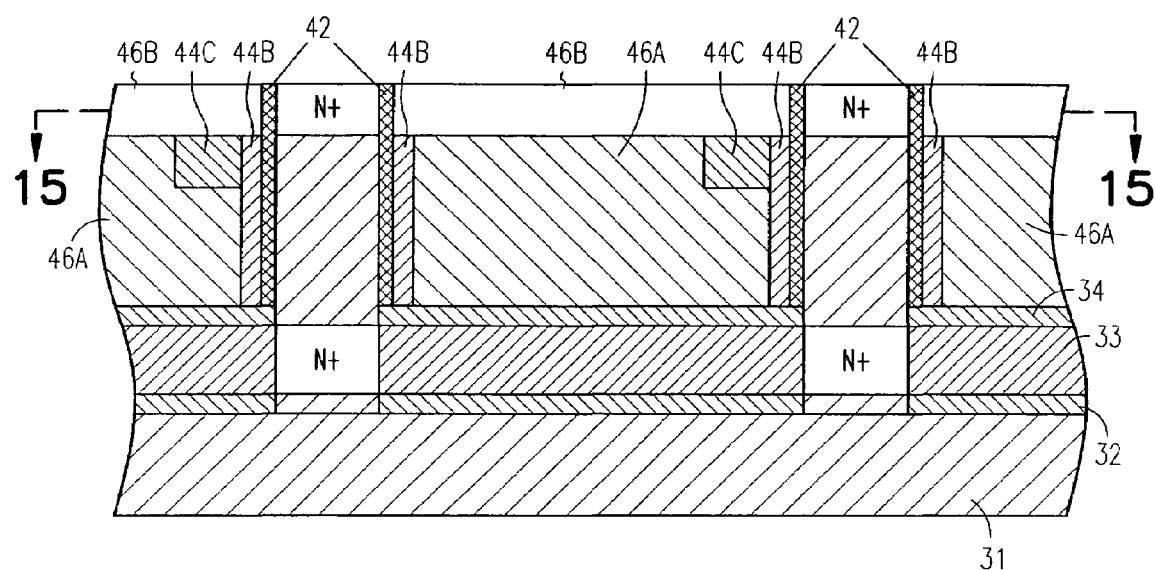
FIGS. 14 and 15 illustrate cross-sectional views of another embodiment of a wordline fabricated in accordance with the present techniques.
Figure 15:
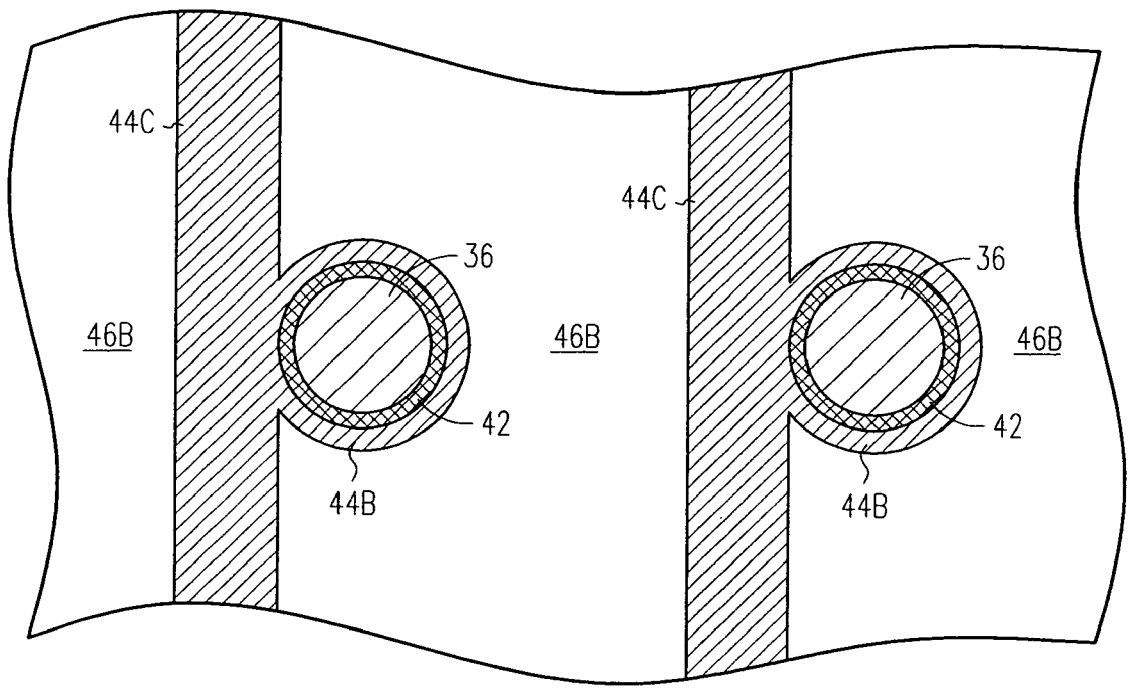

FIG. 14 shows an alternate embodiment of the structure illustrated in FIG. 9, implementing an alternate technique of fabricating the wordline WL. FIG. 15 illustrates a cross-sectional top view of the alternate embodiment illustrated in FIG. 14 and taken along the cut lines 15-15. In the present exemplary embodiment, the wordline polysilicon layer 44 is replaced with a thin gate conductor layer 44B and a thick signal conductor layer 44C. As can be seen, the thin gate conductor layer 44B completely surrounds the selective epitaxy mesa 36. The thin gate conductor layer 44B may have a thickness extending from the surface of mesa 36 of less than 0.1 microns. After deposition, patterning and etching of the thin conductor layer 44B, an insulator layer 46A is disposed. Unlike an embodiment described above, however, the insulator layer 46A is not disposed to cover the entire mesa 36. Insulator layer 46A is disposed such that a portion of the mesa 36 remains uncovered, as illustrated in FIG. 14. Next, the thick signal conductor layer 44C is disposed, patterned and etched form the wordline WL. The gate conductor layer 44B is electrically coupled to the signal conductor layer 44C. In one exemplary embodiment, the gate conductor layer 44B and the signal conductor layer 44C are each polysilicon layers. However, as can be appreciated, the gate conductor layer 44B and the signal conductor layer 44C may be different conductive materials. For instance, the gate conductor layer 44B may be a polysilicon layer, while the signal conductor layer 44C may be a tungsten layer. To complete the structure, a dielectric layer 46B may be disposed to a thickness sufficient to cover the mesas 36, and the surface of the structure may be planarized, as previously described. Advantageously, by providing a thin gate conductor layer 44B coupled to a thick signal conductor layer 44C, a smaller pitch between structures may be implemented, thereby reducing cell size and overall die size.

As can be appreciated, while the present wordline and bitline structures are described as being fabricated through deposition techniques, other processes, such as a damascene process may implemented to form the wordlines and bitlines in accordance with the present techniques. Further, while the present exemplary embodiments have illustrated the annular gate structures with respect to DRAM memory devices, the present techniques may be implemented in a number of other applications, including but not limited to flash memory cells, SRAM memory cells, anti-fuse devices, image sensors and simple logic gates.

Figure 16:
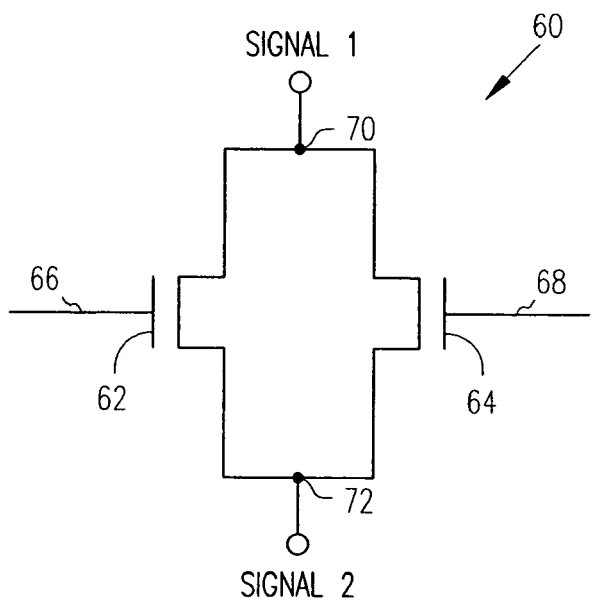
FIGS. 16-18 illustrate an exemplary gate structure fabricated in accordance with the present techniques.
Figure 17:
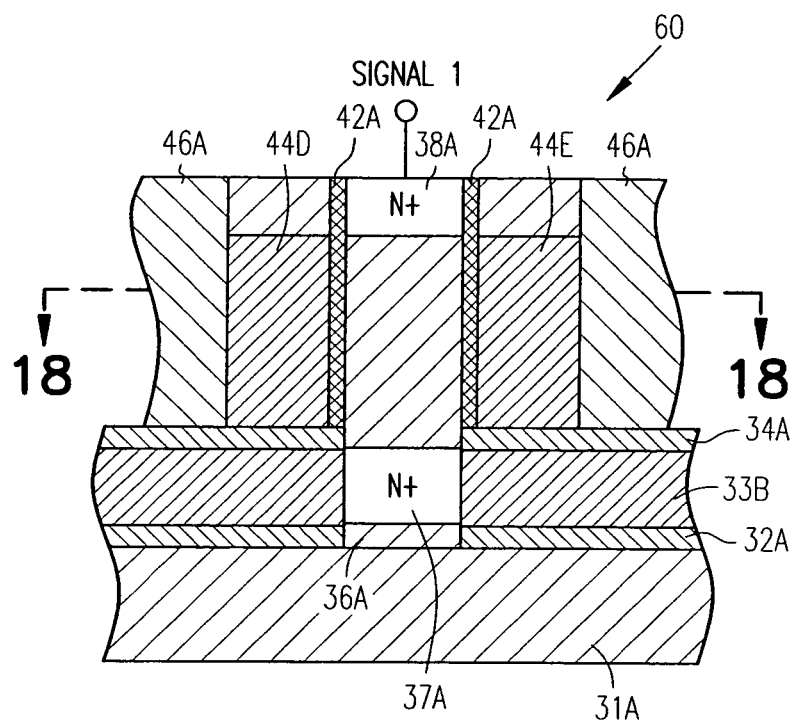

FIG. 16 shows a schematic diagram of simple logical gate structure 60 that may be fabricated in accordance with the present techniques. FIG. 17 shows an exemplary structure that forms part of the logical gate structure 60 illustrated in FIG. 16. The gate structure 60 of FIG. 16 includes a first transistor 62 coupled in parallel with a second transistor 64. Each transistor 62 and 64 has a respective gate terminal 66 and 68. The source terminals of each transistor 62 and 64 are coupled to each other at a common node 70 such that they may be tied to a common reference SIGNAL1. The drain terminals of each transistor 62 and 64 are coupled to each other at a common node 72, such that they can be tied to a common reference SIGNAL2.

Figure 18:
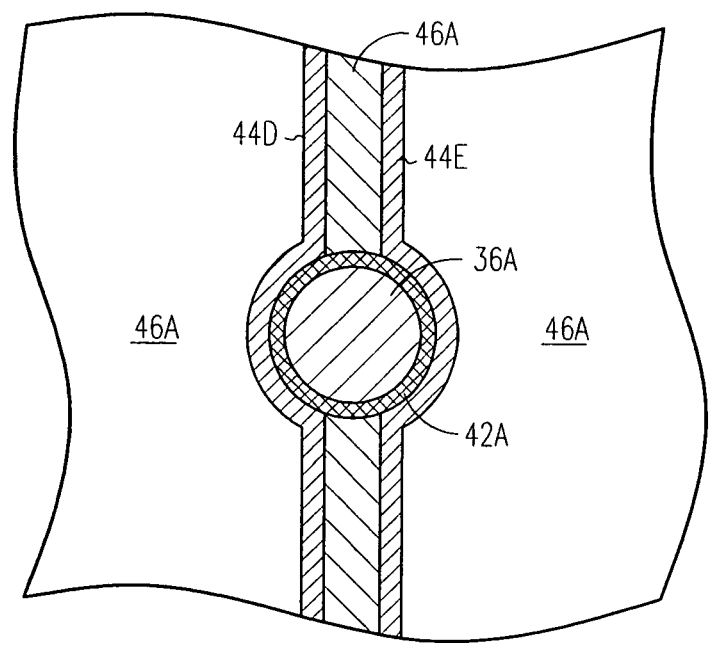

FIG. 17 partially shows the fabrication of the gate structure 60, in accordance with the techniques previously described herein. The deposition techniques, exemplary materials and deposition thicknesses described above may be used to supplement the description of the present exemplary embodiment. For clarity, like reference numerals with an added suffix have been used to illustrate layers previously described. Accordingly, the gate structure 60 includes a substrate 31A, such as a p-doped silicon, having a selective epitaxy, silicon mesa 36A. An insulation layer, such as an oxide layer 32A, is disposed over the substrate 31A. A conductive layer, such as a polysilicon layer 33B, is disposed over the oxide layer 32A. The polysilicon layer 33B may be patterned to form annular rings around the mesa 36A or partial annular rings, such as semi-annular rings. The polysilicon layer 33B forms a signal path. In this embodiment, the polysilicon layer 33B may be implemented to provide the common reference SIGNAL2 that is coupled to the common node 72 of the gate structure 60 (as shown in FIG. 16). A second insulation layer, such as an oxide layer 34A is disposed over the polysilicon layer 33B. Further, n+ contact regions 37A are formed near the base of mesa 36A. The top of mesa 36A may include a contact region 38A which may be electrically coupled to a SIGNAL1 at the common node 70 of the gate structure 60. A gate oxide layer 42A is disposed or grown about the external surface of mesa 36A. Because the gate structure 60 includes two gates 66 and 68, two isolated conductive layers such as polysilicon layers 44D and 44E are disposed. The polysilicon layers 44D and 44E are electrically isolated with respect to each other and form the gates 66 and 68 of the structure 60. As with the polysilicon wordline 44 described above, the polysilicon layers 44D and 44E extend in a direction perpendicular to the page in FIG. 17. Each polysilicon layer 44D and 44E may be patterned to form a partial annular ring about the mesa 36A. To provide electrical isolation of the polysilicon layers 44D and 44E, each of the partial annular rings may extend around approximately one-third of the circumference of mesa 36A. FIG. 18 illustrates a cross-sectional top view of the structure illustrated with reference to FIG. 17 and taken along cut lines 18-18 after deposition of the insulator (dielectric) layer 46A. Alternately, the polysilicon layers 44D and 44E may be electrically isolated by disposing the polysilicon layers 44D and 44E in different planes along the length of the pillar 33A, as can be appreciated by those skilled in the art.

Figure 19:
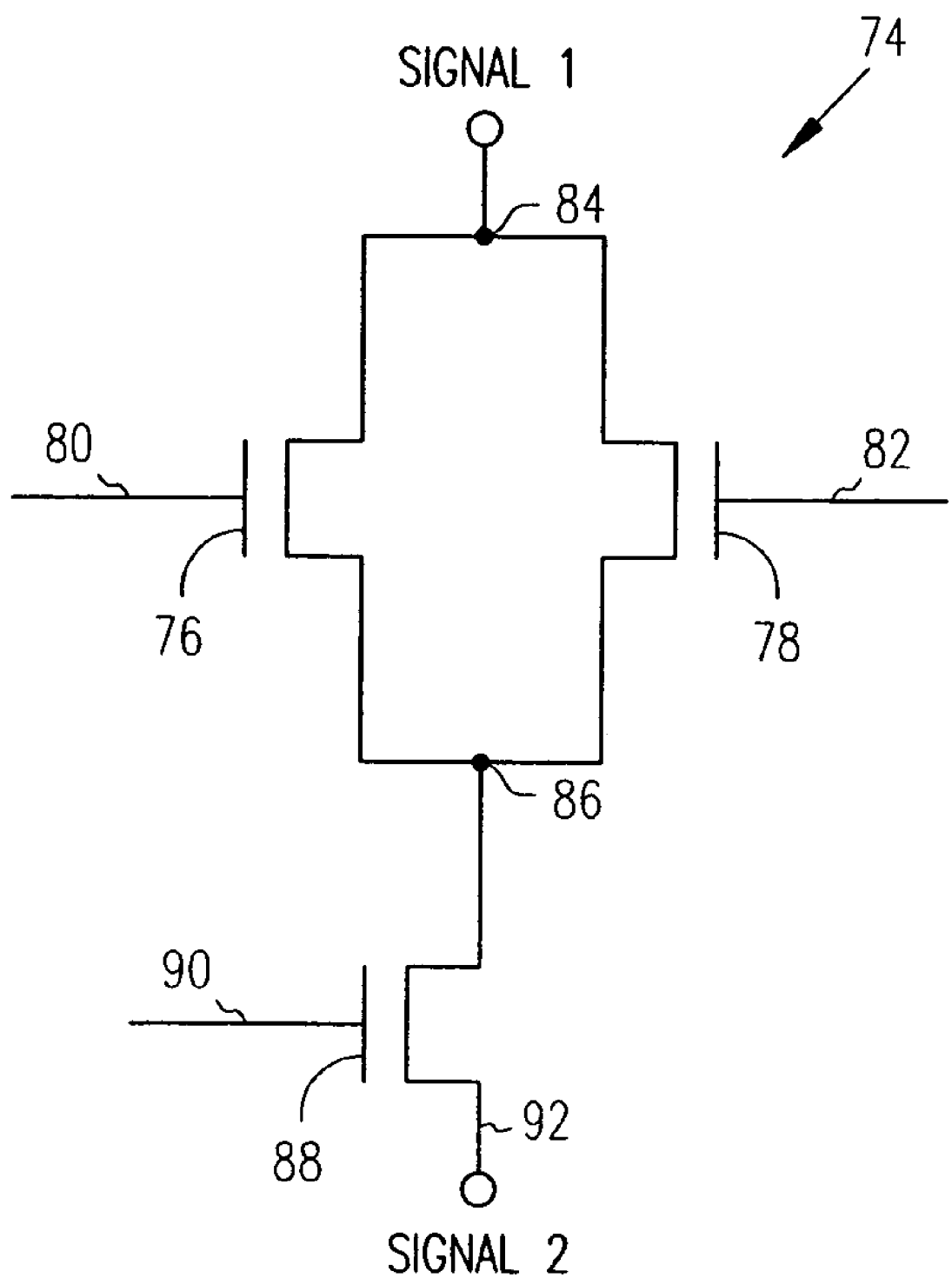
FIG. 19 illustrates a circuit fabricated in accordance with the present techniques.
Figure 20:
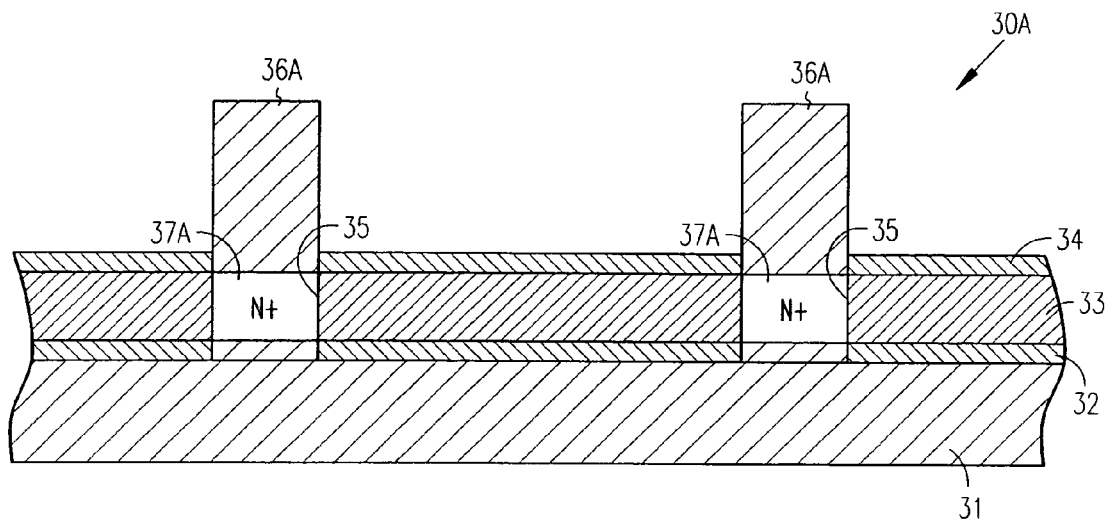
FIGS. 20-25 show a further fabrication method and structure according to an embodiment of the present invention.

FIG. 19 shows a schematic diagram of another logical gate structure 74, which is fabricated according to the teachings of the present techniques. That is, gate 74 includes at least one vertical integrated circuit device fabricated according to the techniques described herein. The gate structure 74 of FIG. 19 includes a first transistor 76 coupled in parallel with a second transistor 78. Each transistor 76 and 78 has a respective gate terminal 80 and 82. The source terminals of each transistor 76 and 78 are coupled to each other at a common node 84 such that they may be tied to a common reference SIGNAL1. The drain terminals of each transistor 76 and 78 are coupled to each other at a common node 86. The common node 86 is coupled to the source terminal of a third transistor 88. The third transistor 88 has a respective gate terminal 90. The drain terminal 92 of the third transistor 88 is coupled to a common reference SIGNAL2.

FIGS. 20-25 show a further embodiment of the present invention. Integrated circuit structures 30A shown in FIGS.

20-25 and include a substrate 31, insulative layer 32, conductor layer 33, insulative layer 34 and recess 35 as described above. A mesa or pillar 36A is grown in the recess 35 using selective epitaxy. A portion 37A of the mesa 36A is doped to form a conductive contact to conductive layer 33. The contact 37A extends throughout the region of the mesa 36A that is vertically aligned with the conductive layer 33 such that the top and bottom surfaces of both the conductive layer 33 and contact portion 37A are essentially coplanar. In an embodiment, the top and bottom surfaces of the contact portion 37A are not in the same plane of the conductive layer 33 such that the dimension of the contact portion 37A is less than the dimension (e.g., height) of the conductive layer. The contact portion 37A is shown with N+ doping, however, it will be recognized that other embodiments have different doping depending on the application and the materials used to form the structure. The mesa 36A does not have the top contact portion at this time.

Figure 21:
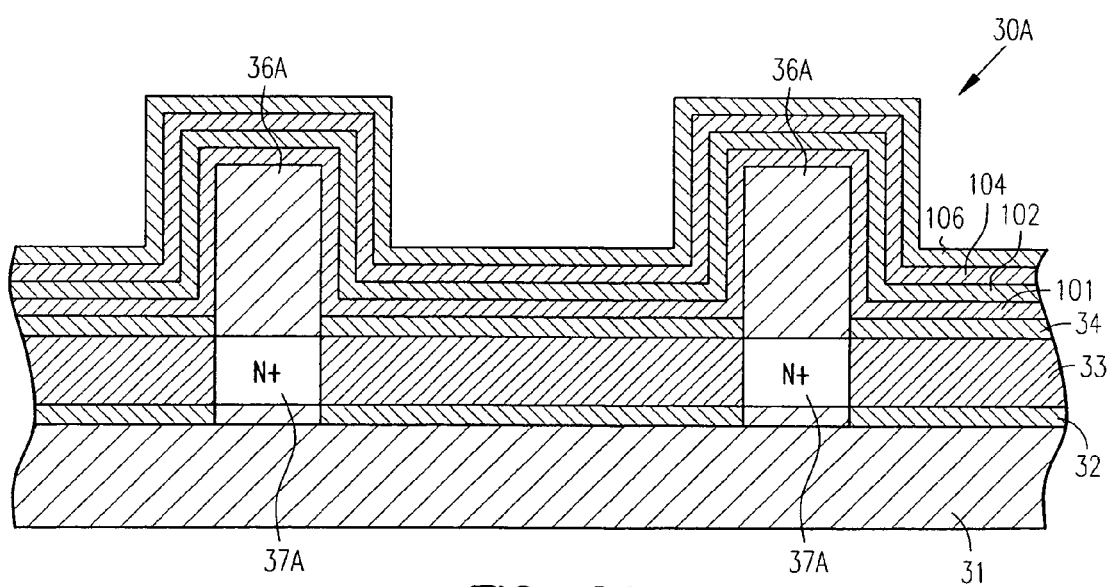

Next, a series of layers are formed over the entire substrate, which in an embodiment is a wafer (FIG. 21). The first layer 101 is an oxide layer formed from a material that is suitable for a gate oxide. The first layer is formed directly over the upper insulating layer 34 and completely covers the mesa 36A. The second layer 102 is formed directly on the first layer. In an embodiment the second layer is a polysilicon layer. The polysilicon, second layer 102 is adapted to form a gate. A third layer 104 is formed over the second layer 102. In an embodiment the third layer is a conductor. In an embodiment, the third layer includes a metal. In an embodiment, the metal third layer includes tungsten. In an embodiment, the metal third layer is a metal alloy. In an embodiment, the third layer includes tungsten nitride. The third layer 104 is patterned to form a signal line or interconnect, e.g., a word line. A fourth layer 106 is formed over the third layer 104. The fourth layer 106 is an insulating layer. In an embodiment the fourth layer is silicon nitride ($Si_3N_4$). Other non-conducting materials could be used for the insulating, fourth layer 106.

Figure 22:
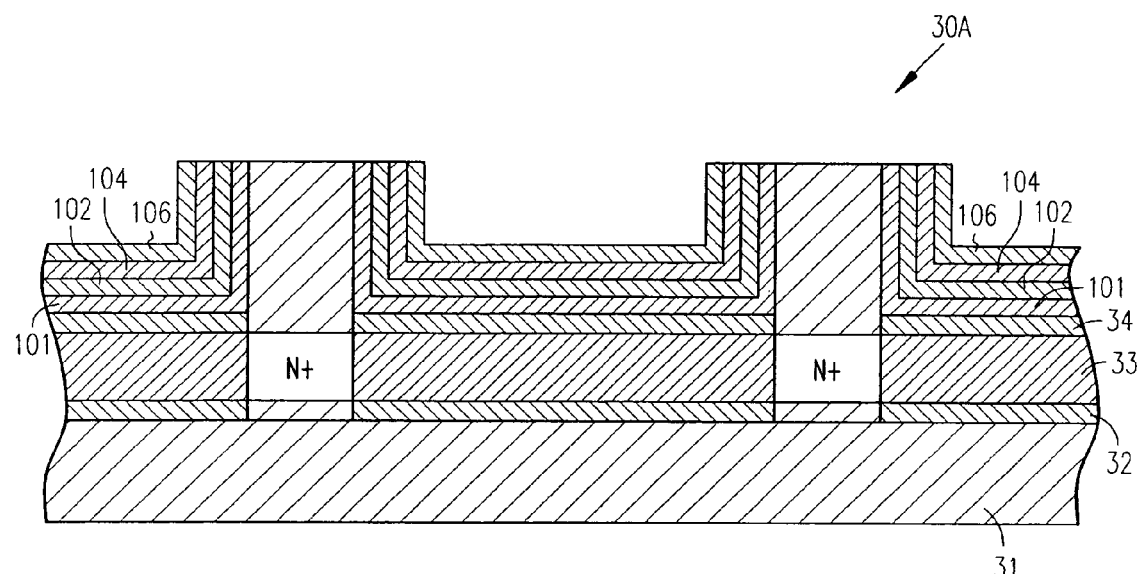
Figure 23:
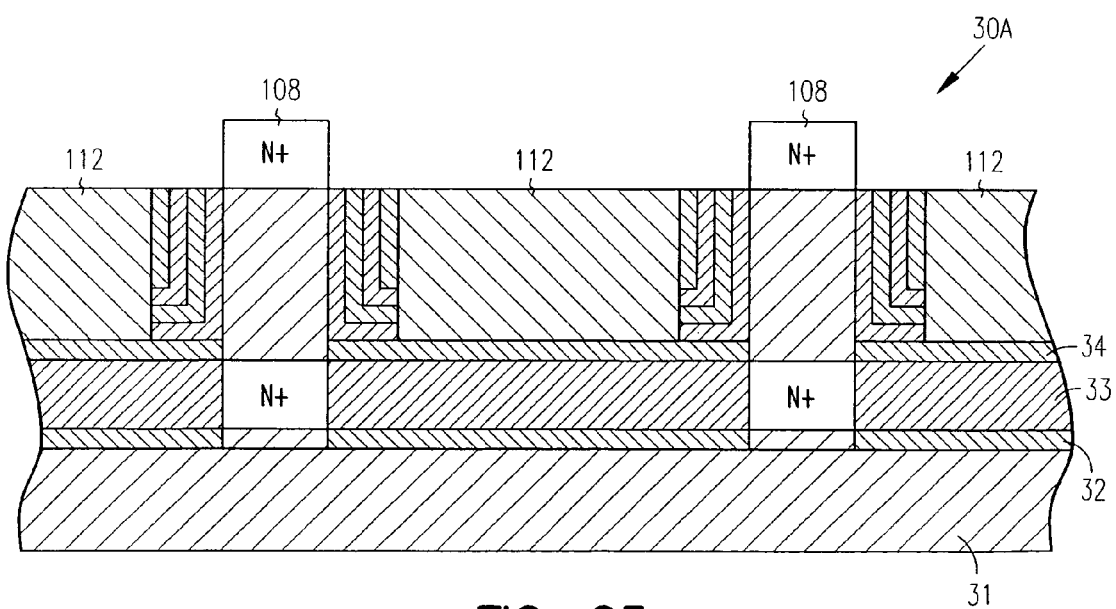

FIG. 22 shows the next step in fabricating the integrated circuit structure 30A. The areas intermediate the mesas 36A are etched to remove the excess portions of layers 101, 102, 104, and 106. This etching process is done to remove horizontal portions of all four layers 101, 102, 104, and 106 down to the insulating layer 34. The horizontal portions of the four layers 101, 102, 104, and 106, which are on top of the mesas 36A, are removed. These top portions of the four layers 101, 102, 104, and 106 are removed by chemical-mechanical planarization or polishing down to at least the tops surface of the mesas 36A. Accordingly, the mesas 36A and the remaining vertical portions four layers 101, 102, 104, and 106 have a coplanar top surface. FIG. 23 shows the areas intermediate the mesas 36A and the remaining vertical portions four layers 101, 102, 104, and 106 are filled with a non-conductive material 112. In an embodiment, the intermediate areas are filled with a glass. In an embodiment, the intermediate areas are filled with an insulative oxide. Non-conductive material 112 fills the intermediate areas prior to removing the layers in an embodiment. After the four layers 101, 102, 104, and 106 are partly removed and the insulating layer 34 intermediate the mesas 36A and remaining portion of the four layers are covered by the non-conductive material 112, the only area whereat silicon is upwardly exposed is the top surface of each mesa 36A. The top contact 108 is now grown using selective epitaxy (FIG. 23). Preferably, the top contact 108 is doped in situ while it is deposited. The top contact 108 extends above the top surfaces of the four layers 101, 102, 103, and 104. In an embodiment, top contact is formed by out diffusion of a dopant from a layer overlying contact 108. Such a layer containing the dopant is subsequently removed.

Figure 24:
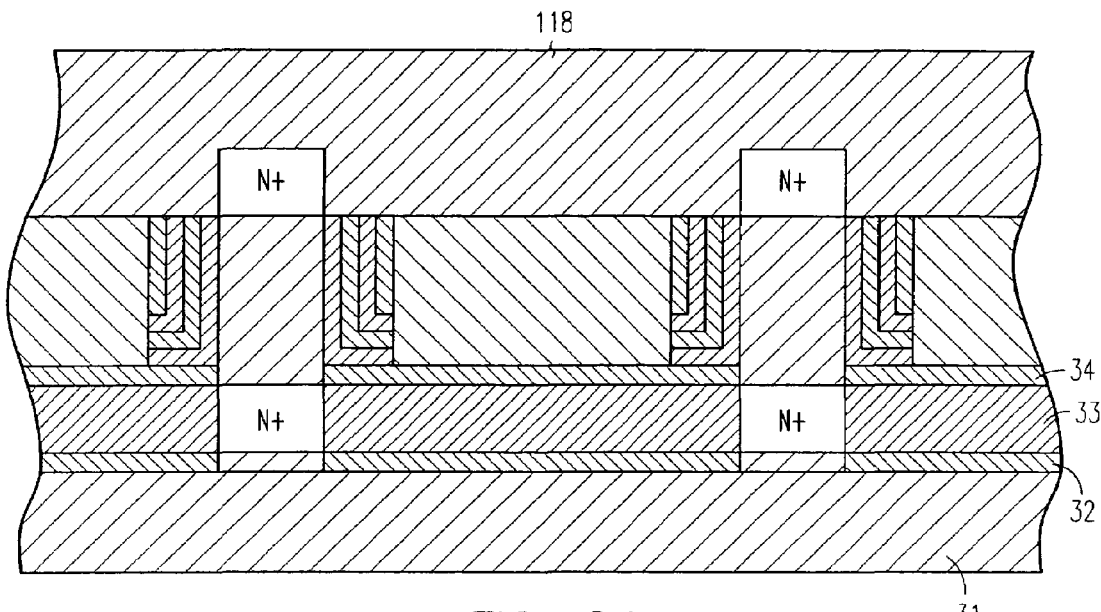
Figure 25:
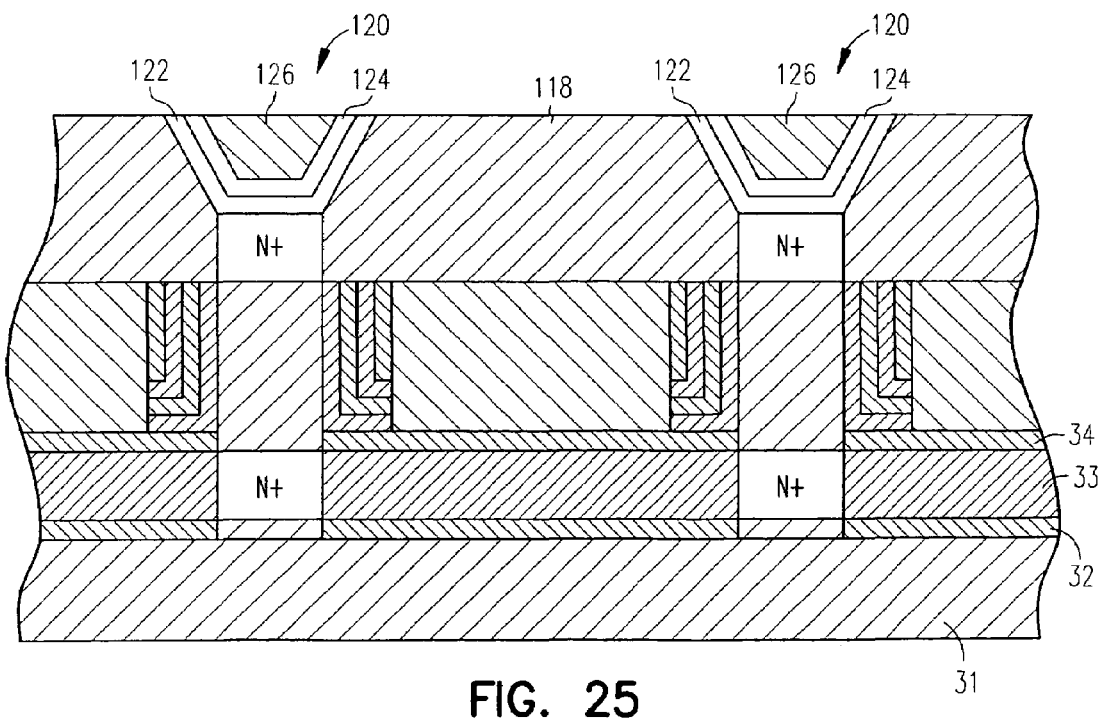

FIGS. 24 and 25 show further steps in fabricating capacitive memory cells on the transistors formed by mesas 36A and the four layers. In an embodiment the capacitive memory cell 120 is a container type. Next an insulating layer 118 is formed on the top surface of the top contact 108, four layers 101, 102, 104, and 106, and the non-conductive material layer 112. In an embodiment this insulating layer 118 includes a glass. In an embodiment, layer 118 includes an insulative oxide material. A recess is formed in the layer 188 and provides a container for the capacitor. A bottom capacitive layer 122 is formed in the recess on the walls of the insulative layer 118 and on the top contact 108. A dielectric layer 124 is formed on the bottom capacitive layer 122. A top capacitive layer 126 is formed on the dielectric layer 124, which completely separates the layers 122 and 126.

The mesa 36, 36A described herein is adapted for use as a conductor between levels in an integrated circuit. It is recognized that the mesa 36, 36A could form a conductive signal line between levels in addition to forming a transistor as described above. Specifically, the mesa 36, 36A is described as a transistor body with doped source\drain regions 37, 38 and a channel region intermediate the source\drain regions. In an embodiment the mesa is doped such that it is always conductive between to conductive layers instead of being a switch device.

Figure 26:
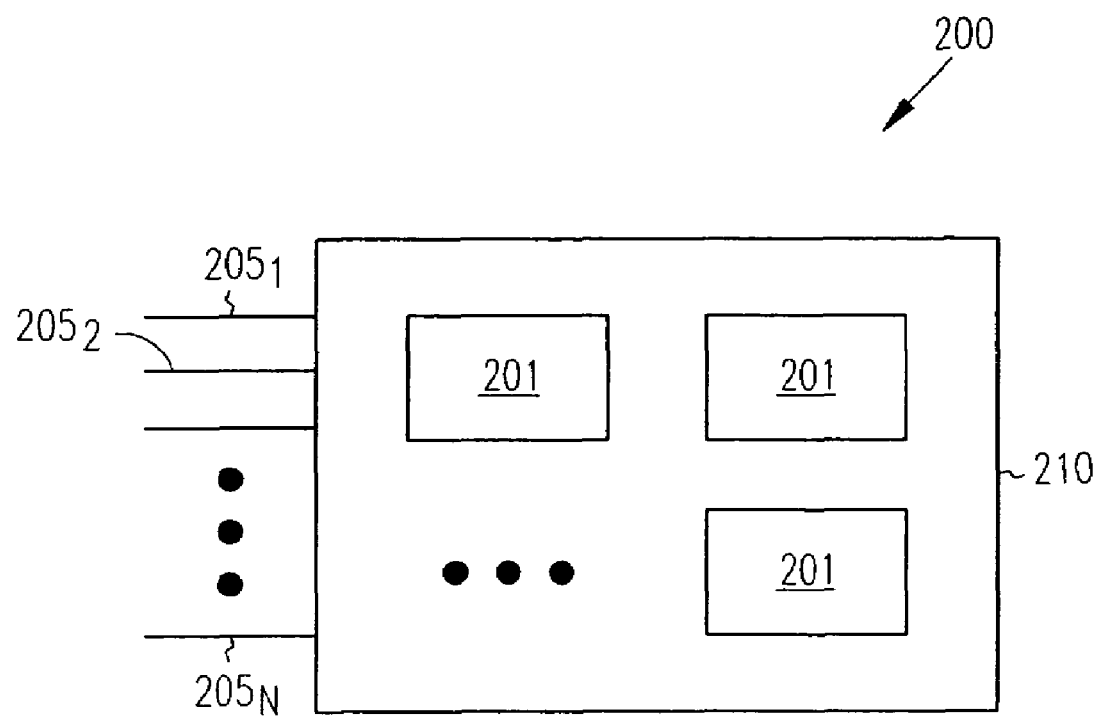
FIG. 26 shows an electronic device in which the present invention may be used.

The integrated circuit structures described herein are fabricated according to integrated circuit fabrication techniques such as selective epitaxy, chemical vapor deposition, physical vapor deposition, and other techniques understood by one of skill in the art. Moreover, the structures described herein are adapted to be used as components in a variety of electronic devices, such as memory modules, circuit modules, electronic systems, and computer systems. As shown in FIG. 26, two or more dies, typically packaged, 201 of the present invention may be combined, with or without protective casing, into a circuit module 200 to enhance or extend the functionality of an individual die 201. At least one die 201 includes a memory cell, vertical transistor, or interlevel signal line formed according to the present invention. Circuit module 200 may include combination of dice 201 representing a variety of functions, or a combination of dice 201 containing the same functionality. In an embodiment, circuit module 200 includes at least one socket, slot, recess, mounting site or the like into which the die 201 is received. Some examples of a circuit module include memory modules, device drivers, power modules, communication modems, processor modules and application-specific modules, and may include multilayer, multichip modules. Such modules will have a chip receiver in which a chip according to the present invention is inserted. Circuit module 200 may be a subcomponent of a variety of electronic systems, such as a clock, a television, a cell phone, a personal computer, an automobile, an industrial control system, an aircraft and others. Such modules will have a circuit module receiver in which a circuit module according to the present invention is inserted. Circuit module 200 will have a variety of leads $205_1$ through $205_N$ extending therefrom. The leads $205_1$ through $205_N$ are adapted to connect the circuit module to other electrical circuits to provide an interface for unilateral or bilateral communication and control. Some examples of an interface that is a user interface include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. A user interface may further describe access ports provided to an electronic system. Access ports are used to connect an electronic system to the more tangible user interface components previously exemplified. One or more of the circuit modules may be a processor providing some form of manipulation, control or direction of inputs from or outputs to a user interface, or of other information either preprogrammed into, or otherwise provided to, an electronic system. As will be apparent from the lists of examples previously given, an electronic system will often be associated with certain mechanical components (not shown) in addition to a circuit modules and an user interface. It will be appreciated that one or more circuit modules in an electronic system can be replaced by a single integrated circuit. Furthermore, an electronic system may be a subcomponent of a larger electronic system.

CONCLUSION

The present disclosure describes a method for fabricating a vertical transistor and a vertical memory cell. Vertical structures extend outwardly from the planar surface of a substrate, i.e., upwardly from a top surface of a wafer. Such vertical structures use less real estate (area) on a substrate than convention planar (horizontal) transistors and memory cells. There is a constant desire in the field of integrated circuits to pack more devices and structures on a substrate or die. There is also a further desire to fabricate smaller dies that have at least the same functionality as prior larger dies. The present invention addresses these desires. Moreover, there is a constant desire to reduce fabrication complexity to achieve fewer defects caused by complex fabrication techniques and to increase fabrication throughput. For example, the present invention may not require shallow trench isolation between devices thereby freeing more area on the substrate for active device fabrication.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other integrated circuit processing equipment may be utilized in conjunction with the invention. For another example, other integrated circuit fabrication processes are adapted to produce the dies and chips according to the present invention. Accordingly, this application is intended to cover any adaptations or variations of the invention. It is manifestly intended that this invention be limited only by the following claims and equivalents thereof.

I claim:

1. A vertical memory cell, comprising:
   a substantially planar surface;
   a first insulator adjacent the planar surface,
   a second insulator spaced apart from the first insulator, wherein an annular depression is formed in the first insulator and the second insulator;
   an access device including a mesa, the mesa formed partly within the annular depression and extending outwardly from the planar surface;
   a buried conductive path bounded by the first insulator and the second insulator, the buried conductive path enclosing a section of the mesa, the mesa circumferentially contacting the buried conductive path at a specified radius along a vertical sidewall region of the mesa above the first insulator, wherein a portion of the mesa extending radially inward from the buried conductive path and extending vertically along the buried conductive path between the first insulator and the second insulator consists essentially of dopant atoms of one conductivity type, and wherein the dopant atoms in the portion form with a diffused concentration profile in the radial direction; and
   a storage device on the mesa.

2. The memory cell of claim 1, wherein the first and the second insulators are configured to permit current in the buried conductive path to flow into the mesa only across the specified radius.

3. The memory cell of claim 1, wherein the annular depression is formed with a uniform radius.

4. The memory cell of claim 1, wherein the annular depression is formed having the specified radius.

5. The memory cell of claim 1, wherein the buried conductive path contacts the mesa along the circumference only between the first and the second insulators.

6. The memory cell of claim 1, wherein the buried conductive path is a bit line conductor.

7. The memory cell of claim 1, wherein the mesa electrically contacts the buried conductive path only along the vertical sidewall region above the first insulator.

8. The memory cell of claim 1, wherein the mesa includes a diffused dopant concentration profile in a vertical region configured to contact the storage device.

9. A vertical memory cell, comprising:
   a substantially planar surface;
   a first insulator adjacent the planar surface;
   a second insulator spaced apart from the first insulator, wherein the first insulator and the second insulator are used to form a portion of the annular recess;
   an access device including a mesa, the mesa formed partly within the annular recess and extending outwardly from the planar surface;
   a buried conductive path confined by the first insulator and the second insulator, the buried conductive path enclosing a section of the mesa, the mesa circumferentially contacting the buried conductive path at a specified radius along a vertical sidewall region of the mesa above the first insulator, wherein a portion of the mesa extending radially inward from the buried conductive path and extending vertically along the buried conductive path between the first insulator and the second insulator consists essentially of dopant atoms of one conductivity type, and wherein the dopant atoms in the portion arrange in an abrupt concentration profile in the radial direction; and
   a storage device on the mesa.

10. The memory cell of claim 9, wherein the first and the second insulators are configured to permit a voltage transmitted along in the buried conductive path to couple to the mesa only at the specified radius.

11. The memory cell of claim 9, wherein the annular recess is formed with a specified radius.

12. The memory cell of claim 9, wherein the annular recess is formed having the specified radius.

13. The memory cell of claim 9, wherein the buried conductive path contacts the mesa only along the circumference between the first and the second insulators.

14. The memory cell of claim 9, wherein the buried conductive path is a bit line conductor.

15. The memory cell of claim 9, wherein the mesa is configured to electrically contact the buried conductive path only along the vertical sidewall region above the first insulator.

* * * * *

UNITED STATES PATENT AND TRADEMARK OFFICE
CERTIFICATE OF CORRECTION

PATENT NO. : 7,372,091 B2  Page 1 of 1
APPLICATION NO. : 10/765301
DATED : May 13, 2008
INVENTOR(S) : Leslie It is certified that error appears in the above-identified patent and that said Letters Patent is hereby corrected as shown below:

On the title page, in field (54), under "Title", in column 1, line 2, after "COMPONENTS" insert -- AND METHODS --.

In column 1, line 2, after "COMPONENTS" insert -- AND METHODS --.

Signed and Sealed this

Twenty-sixth Day of August, 2008

JON W. DUDAS
*Director of the United States Patent and Trademark Office*